United States Patent
Han

(10) Patent No.: US 10,635,847 B2
(45) Date of Patent: Apr. 28, 2020

(54) SIMULATION SWITCHING DEVICE OF COMPUTER CONTROL CHIPS

(71) Applicant: EVGA CORPORATION, New Taipei (TW)

(72) Inventor: Tai-Sheng Han, New Taipei (TW)

(73) Assignee: EVGA CORPORATION, New Taipei (TW)

( * ) Notice: Subject to any disclaimer, the term of this patent is extended or adjusted under 35 U.S.C. 154(b) by 387 days.

(21) Appl. No.: 15/450,039

(22) Filed: Mar. 6, 2017

(65) Prior Publication Data

US 2018/0203965 A1   Jul. 19, 2018

(30) Foreign Application Priority Data

Jan. 16, 2017   (TW) .............................. 106200778 U

(51) Int. Cl.
*G06F 30/367* (2020.01)
*G06F 1/3296* (2019.01)

(52) U.S. Cl.
CPC .......... *G06F 30/367* (2020.01); *G06F 1/3296* (2013.01); *Y02D 10/172* (2018.01)

(58) Field of Classification Search
None
See application file for complete search history.

(56) References Cited

U.S. PATENT DOCUMENTS

| | | | | |
|---|---|---|---|---|
| 6,035,357 A | * | 3/2000 | Sakaki | G06K 7/0008 710/301 |
| 6,938,176 B1 | * | 8/2005 | Alben | G06F 1/10 713/323 |
| 7,619,444 B1 | * | 11/2009 | Shaikh | H03K 19/017545 326/68 |
| 2013/0110437 A1 | * | 5/2013 | Singh | G01K 15/00 702/85 |
| 2014/0218001 A1 | * | 8/2014 | Dally | G05F 1/618 323/285 |
| 2015/0061633 A1 | * | 3/2015 | Marchand | G06F 1/00 323/299 |

* cited by examiner

*Primary Examiner* — Suzanne Lo
(74) *Attorney, Agent, or Firm* — Leong C. Lei

(57) ABSTRACT

A simulation switching device of computer control chips is disclosed, including an addin card body, a plurality of computer control chips having different operation frequencies arranged on the addin card body, a graphics processing device in information connection with each of the computer control chips, an operation control device in information connection with each of the computer control chips and the graphics processing device, and an inspection module in information connection with the operation control device. To use, the operation control device detects a voltage of the graphics processing device. If the voltage is in an unstable condition, then the inspection module performs simulation to inspect a condition that will be generated by driving another one of the computer control chips that has a relatively high operation frequency, and automatic switching is made to the computer control chip having the relatively high operation frequency to make the voltage stable.

1 Claim, 6 Drawing Sheets

SIMULATION SWITCHING DEVICE OF COMPUTER CONTROL CHIPS

(a) TECHNICAL FIELD OF THE INVENTION

The present invention relates generally to a simulation switching device of computer control chips, and more particularly to a simulation switching device of computer control chips that conducts switching in an automatic way to facilitate the use thereof.

(b) DESCRIPTION OF THE PRIOR ART

A known graphics card comprises a basic input/output system (BIOS) and the BIOS has a predetermined range of operation frequency. The operation frequency may be varied according to use by a user. If the user needs to increase the performance of the known graphics card due to certain reasons, such as playing a game, a drive program of the graphics card may drive the known graphics card such that the frequency and voltage thereof are increased. However, when the desired performance goes beyond the predetermined range of operation frequency of the BIOS, the known graphics card may get down, forcing the frequency and voltage to get lowered. And then, the graphics card drive program may once again drive the graphics card to increase the frequency and voltage due to the game. This would cyclically repeat, making the known graphics card in an unstable condition and no way to achieve suitable performance.

Thus, it is a challenge of those devoted in this field to provide a solution to overcome such problems.

SUMMARY OF THE INVENTION

In view of the above problems and drawbacks, the present invention aims to provide simulation switching device of computer control chips that conducts switching in an automatic way to facilitate the use thereof.

The primary objective of the present invention is to provide automatic switching of computer control chips according to a situation thereof in order to achieve desired performance.

To achieve the objective, the present invention comprises an addin card body, and the addin card body is provided thereon with a plurality of computer control chips having different operation frequencies. Arranged at one side of and in information connection with the computer control chips is at least one graphics processing device provided on the addin card body. The graphics processing device is provided, at one side thereof and in information connection therewith, with at least one operation control device arranged on the addin card body. The operation control device is in information connection with each of the computer control chips and the operation control device is in information connection with at least one inspection module.

To use the addin card body, a single one of the computer control chips is operated in combination with the graphics processing device to generate image information. The operation control device continuously and constantly detects and monitors the voltage of the graphics processing device. When the voltage is in an unstable (fluctuating) condition, it is indicated that the addin card body does not provide sufficient performance and under the condition that the previously mentioned one of the computer control chips that is kept in operation, the inspection module is operable to conduct inspection simulation in order to inspect and simulate a condition that will be generated by driving another one of the computer control chips that has a relatively high operation frequency. When it is determined that switching to drive said another one of the computer control chips that has a relatively high operation frequency would make the voltage approach a stable condition, then an operation of switching to driving of said another one of the computer control chips that has a relatively high operation frequency is automatically conducted in order to provide sufficient performance for use. With such a technique, the problems and drawbacks that the prior art graphics card cannot provide suitable performance can be overcome and automatic switching can be achieved to facilitate use in order to provide an advantage of improving utilization thereof.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
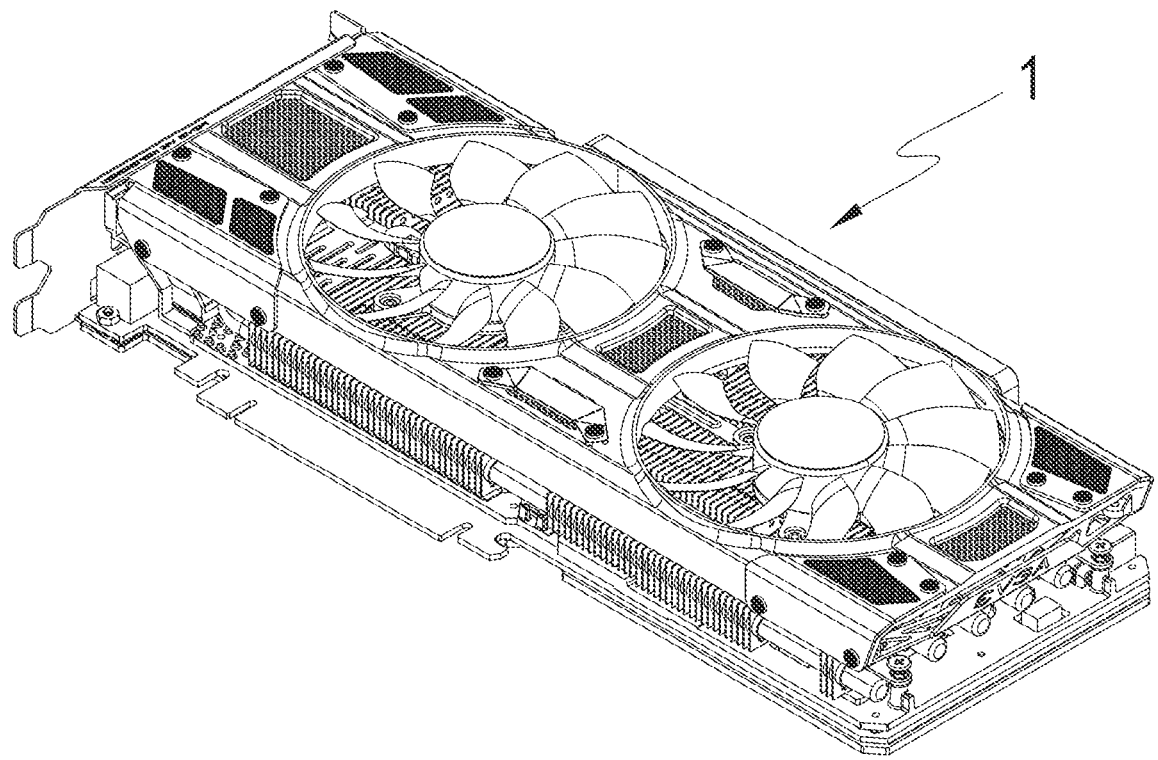
FIG. 1 is a perspective view of a preferred embodiment of the present invention.
Figure 2:
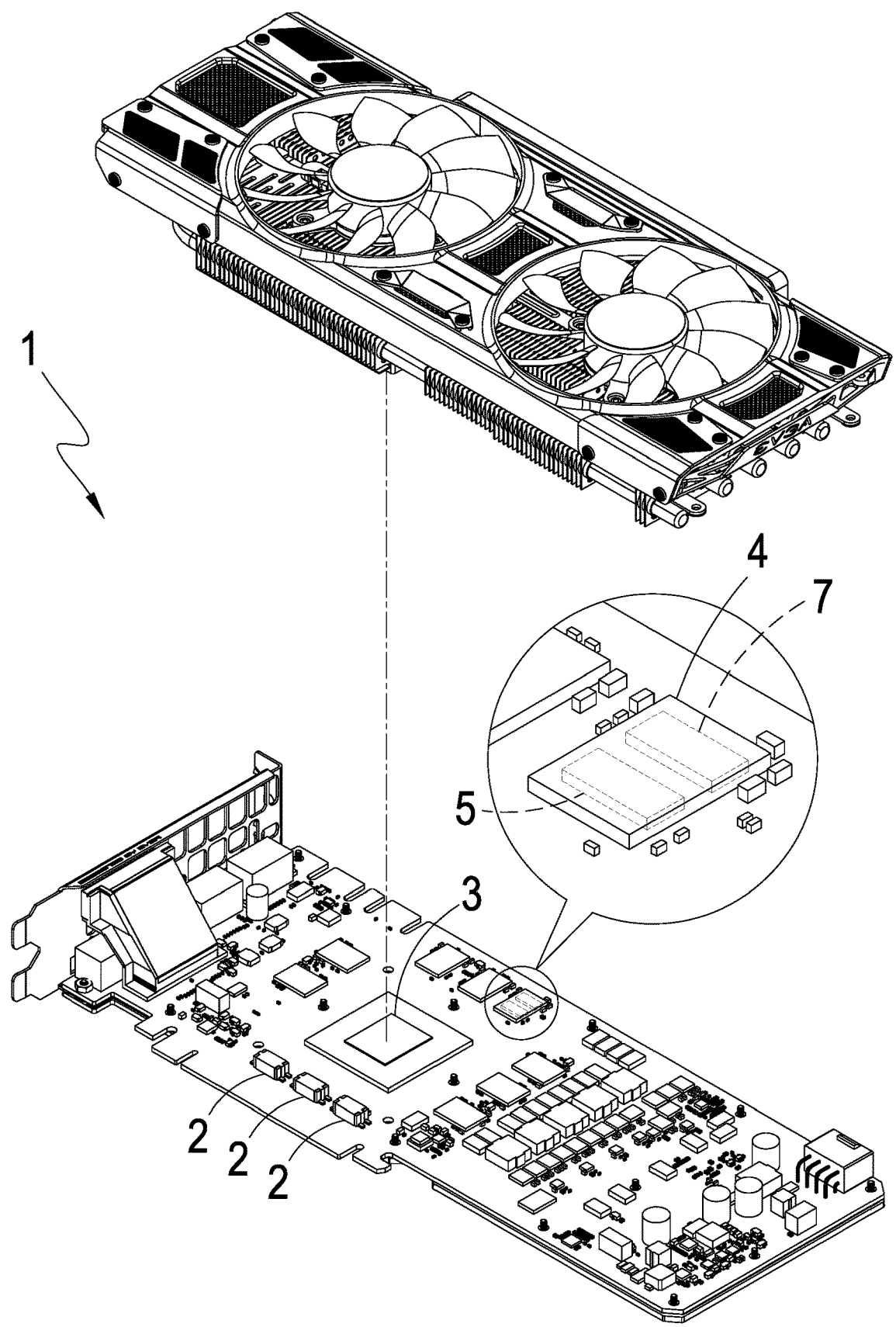
FIG. 2 is an exploded view of the preferred embodiment of the present invention.
Figure 3:
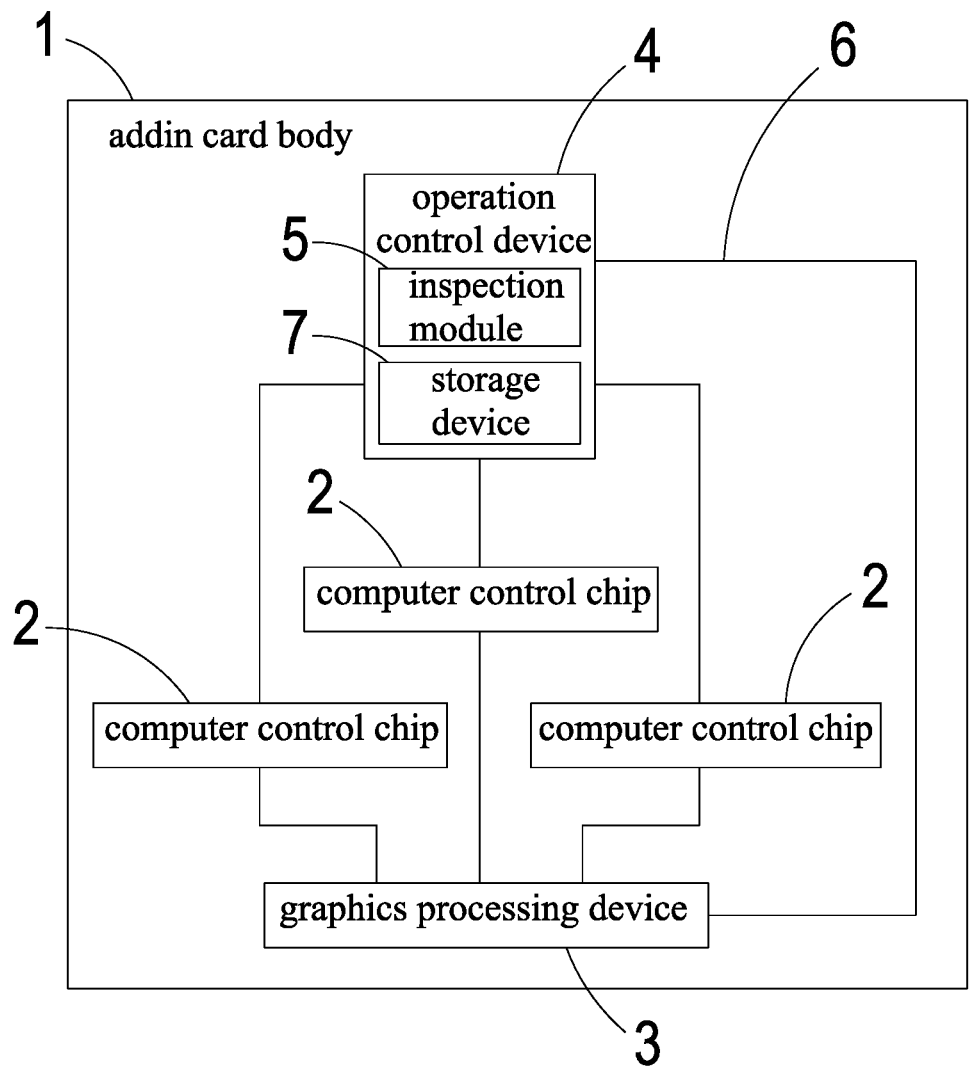
FIG. 3 is a structure block diagram of the preferred embodiment of the present invention.

Referring to FIGS. 1-3, which are respectively a perspective view of a preferred embodiment of the present invention, an exploded view of the preferred embodiment of the present invention, and a structure block diagram of the preferred embodiment of the present invention, it can be seen from these drawings that the present invention comprises an addin card body 1, a plurality of computer control chips 2 (three being taken as an example in the drawings for illustration) having different operation frequencies, at least one graphics processing device 3, at least one operation control device 4, at least one inspection module 5, at least one power supply circuit 6, and at least one storage device 7. Each of the computer control chips 2 is arranged on the addin card body 1. The graphics processing device 3 is arranged on the addin card body 1 and located beside each of the computer control chips 2 to be in information connection therewith. The operation control device 4 is arranged on the addin card body 1 and located at one side of the graphics processing device 3 and in information connection with each of the computer control chips 2 and the graphics processing device 3. The inspection module 5 is arranged in the operation control device 4 and in information connection therewith to selectively conduct an inspection operation on each of the computer control chips 2. The power supply circuit 6 is arranged on the addin card body 1. The storage device 7 is in information connection with and arranged at one side of the inspection module 5. The instant embodiment is structured, as an example, that the storage device 7 is located in the inspection module 5. (Alternatively, the storage device 7 can be arranged on the addin card body 1 to put the present invention into practice.)

The power supply circuit 6 is arranged to power each of the computer control chips 2, the graphics processing device 3, and the operation control device 4. The operation control device 4 may detect an operation voltage of the graphics processing device 3 by means of the power supply circuit 6. The inspection module 5 selectively conduct an inspection operation on each of the computer control chips 2 according to the result of detection of the operation control device 4. The above provides a description of a configuration for embodying the present invention; however, the configuration of the present invention is not limited to such an example.

Figure 4:
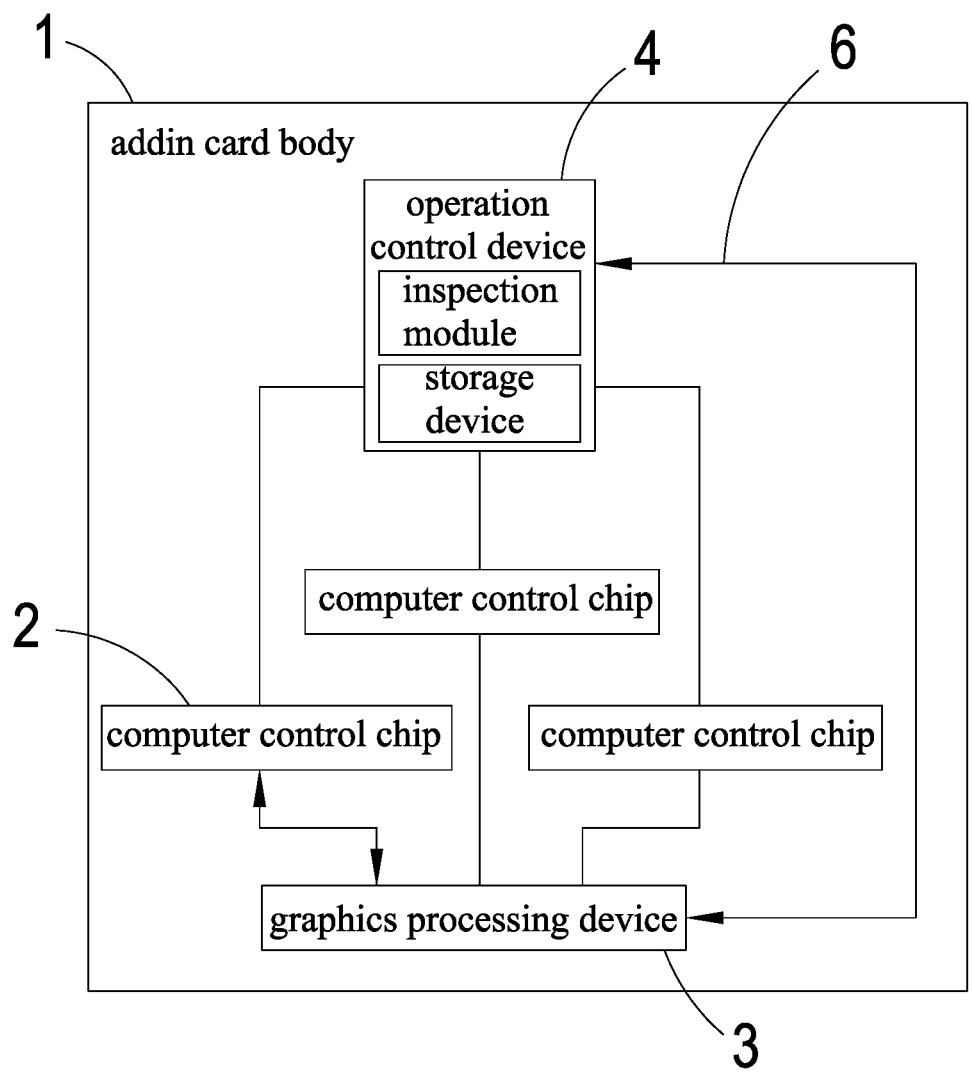
FIG. 4 is a schematic view illustrating detection conducted with the preferred embodiment of the present invention.

Referring collectively to FIGS. 1-6, which are respectively a perspective view of a preferred embodiment of the present invention, an exploded view of the preferred embodiment of the present invention, a structure block diagram of the preferred embodiment of the present invention, a schematic view illustrating detection conducted with the preferred embodiment of the present invention, a schematic view illustrating inspection conducted with the preferred embodiment of the present invention, and a schematic view illustrating switching conducted with the preferred embodiment of the present invention, it can be clearly seen from the drawings that to use the present invention, the addin card body 1 is first put into operation and a predetermined single one of the computer control chips 2 and the graphics processing device 3 are driven and put into operation in collaboration with each other to generate image information according to desired performance. Referring to FIG. 4, the operation control device 4 continuously detects an operation voltage of the graphics processing device 3 through the power supply circuit 6. If result of detection indicates the operation voltage is in a stable condition (maintaining generally a fixed value), then the addin card body 1 is regarded as providing sufficient performance, and the operation control device 4 maintains the operation of detection.

Figure 5:
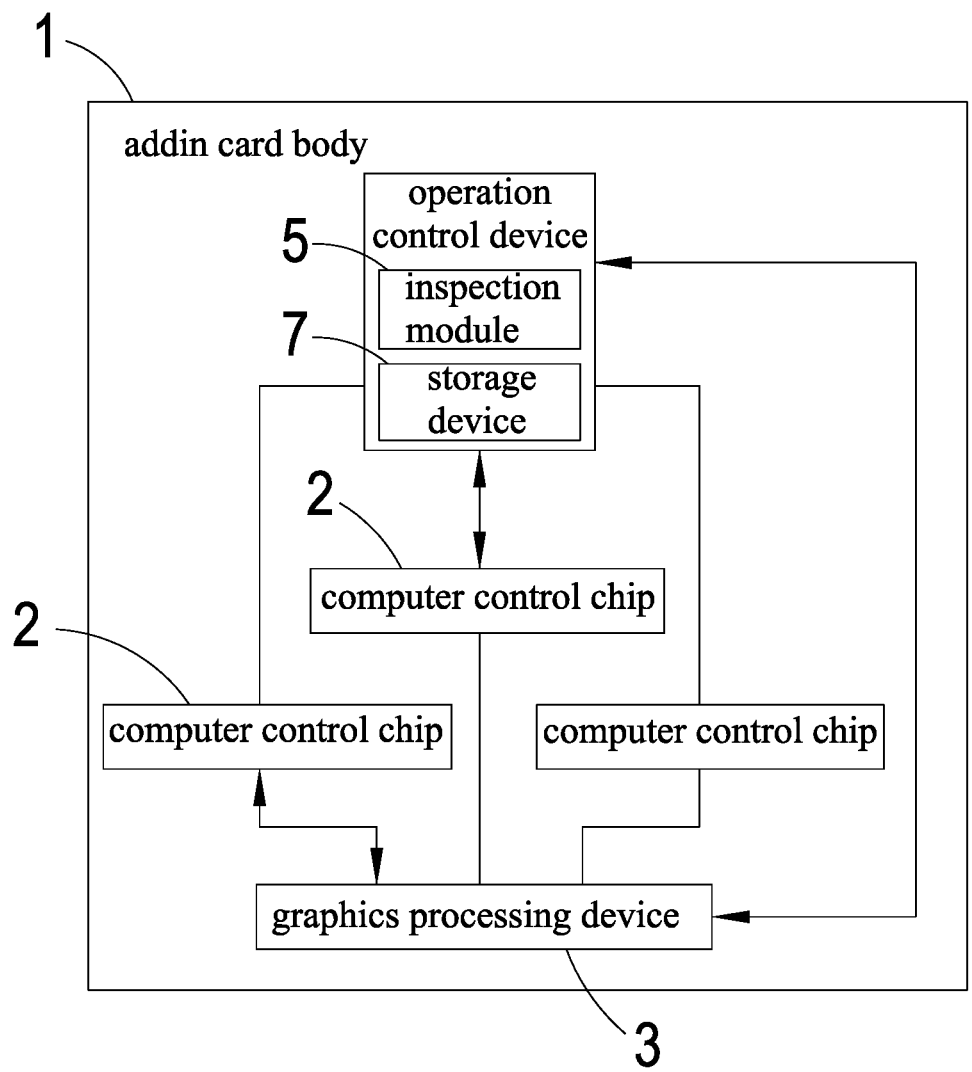
FIG. 5 is a schematic view illustrating inspection conducted with the preferred embodiment of the present invention.
Figure 6:
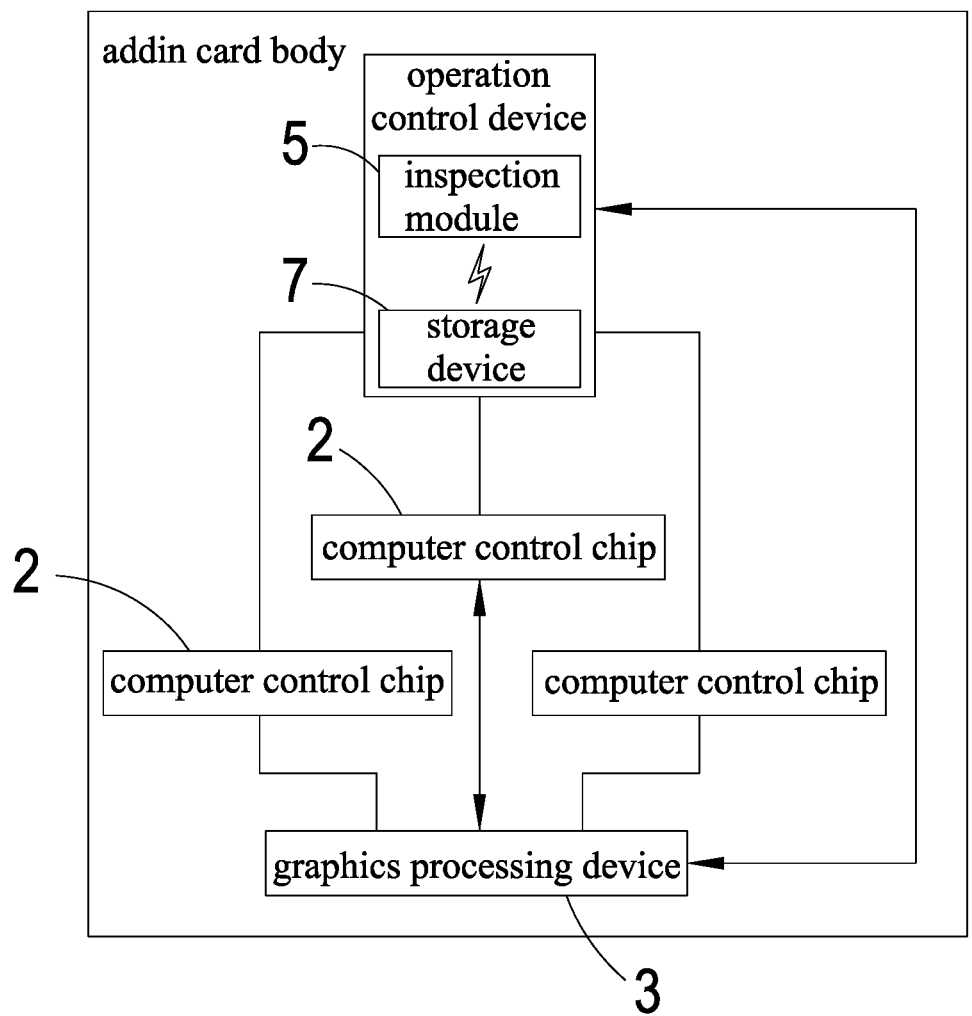
FIG. 6 is a schematic view illustrating switching conducted with the preferred embodiment of the present invention.

Referring simultaneously to FIGS. 5 and 6, if the result of detection indicates the operation voltage is in an unstable (fluctuating) condition, then the addin card body 1 is regarded as incapable of providing sufficient performance. Under such a condition, the operation of the predetermined one of the computer control chips 2 is maintained and the inspection module 5 is applied to conduct inspection simulation in order to inspect and simulate a condition that is generated by driving another one of the computer control chips 2 that has a relatively high operation frequency according to the current requirement. When the result of inspection simulation is such that a determination that driving another one of the computer control chips 2 that has a relatively high operation frequency would provide sufficient performance to make the operation voltage become stable, the inspection module 5 conducts automatically a switching operation to stop the operation of the predetermined one of the computer control chips 2 and to drive said another one of the computer control chips 2 having a relatively high operation frequency so as to put it into operation in collaboration with the graphics processing device 3 to generate image information according to the desired performance for use.

In addition, the inspection module 5 may make the storage device 7 to record the operation condition before switching and the result of switching so that when an operation voltage unstable (fluctuating) condition is encountered in a subsequent operation, the inspection module 5 may check with the storage device 7 to confirm if it is similar to said operation condition before switching. If they match, then a switching operation is automatically conducted according to said result of switching.

Thus, the key factor that the switch simulation device of computer control chips according to the present invention may improve the prior art is that with a collaborative combination of the computer control chips 2, the graphics processing device 3, the operation control device 4, and the inspection module 5, the present invention may provide an advantage of utilization by automatically conducting a switching operation to facilitate the use thereof.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. A simulation switching device of computer control chips, comprising:
   an addin card body;
   a plurality of computer control chips having different operation frequencies, the computer control chips being each arranged on the addin card body;
   one graphics processing device, wherein the graphics processing device is arranged on the addin card body and is located at one side of each of the computer control chips to be in information connection the computer control chips;
   one operation control device, wherein the operation control device is arranged on the addin card body and is located at one side of the graphics processing device to be in information connection with each of the computer control chips and the graphics processing device; and
   one inspection module, wherein the inspection module is arranged on the operation control device and in information connection with the operation control device for selectively conducting inspection on each of the computer control chips;

wherein the addin card body is provided with one power supply circuit, the power supply circuit being arranged to power each of the computer control chips, the graphics processing device, and the operation control device;

wherein the operation control device is operable to detect an operation voltage of the graphics processing device by means of the power supply circuit;

wherein the inspection module selectively conducts the inspection on each of the computer control chips according to a result of detection of the operation control device;

wherein the inspection module is provided with one storage device that is arranged at one side of the inspection module and in information connection with the inspection module; and wherein the inspection module selectively carries out a simulation operation on the plurality of computer control chips in order to select one of the plurality of computer control chips that provides operation performance fit to a predetermined operation condition and to switch among the plurality of computer control chips.

* * * * *